(12) United States Patent
Ouderkirk et al.

(10) Patent No.: US 11,889,763 B2
(45) Date of Patent: Jan. 30, 2024

(54) ACTUATOR WITH VARIABLE CYLINDER

(71) Applicant: META PLATFORMS TECHNOLOGIES, LLC, Menlo Park, CA (US)

(72) Inventors: Andrew John Ouderkirk, Kirkland, WA (US); Spencer Allan Wells, Seattle, WA (US); Christopher Stipe, Woodinville, WA (US); Kenneth Alexander Diest, Kirkland, WA (US); Christopher Yuan Ting Liao, Seattle, WA (US); Nagi Hosni Elabbasi, Needham, MA (US); James Howard Thomas Ransley, Medford, MA (US); Taha Masood, Sammamish, WA (US); Liliana Ruiz Diaz, Redmond, WA (US); Laura Cressman, Carnation, WA (US)

(73) Assignee: Meta Platforms Technologies, LLC, Menlo Park, CA (US)

(*) Notice: Subject to any disclaimer, the term of this patent is extended or adjusted under 35 U.S.C. 154(b) by 301 days.

(21) Appl. No.: 17/183,302

(22) Filed: Feb. 23, 2021

(65) Prior Publication Data
US 2022/0271214 A1 Aug. 25, 2022

(51) Int. Cl.
| | |
|---|---|
| *G02B 3/12* | (2006.01) |
| *H10N 30/20* | (2023.01) |
| *G02B 26/00* | (2006.01) |
| *H02N 2/04* | (2006.01) |
| *H10N 30/05* | (2023.01) |
| *H10N 30/067* | (2023.01) |
| *H10N 30/87* | (2023.01) |

(52) U.S. Cl.
CPC .............. *H10N 30/20* (2023.02); *G02B 3/12* (2013.01); *G02B 26/004* (2013.01); *H02N 2/04* (2013.01); *H10N 30/05* (2023.02); *H10N 30/067* (2023.02); *H10N 30/871* (2023.02)

(58) Field of Classification Search
CPC ........ G02B 3/12; G02B 26/004; G02B 1/115; G02C 7/085
See application file for complete search history.

(56) References Cited

U.S. PATENT DOCUMENTS

| | | | |
|---|---|---|---|
| 10,634,824 B1* | 4/2020 | Ouderkirk | G02B 27/0172 |
| 2010/0157438 A1* | 6/2010 | Griffith | G02B 3/14 |
| | | | 359/666 |
| 2011/0038625 A1* | 2/2011 | Zellers | G02B 26/0875 |
| | | | 396/133 |

OTHER PUBLICATIONS

International Search Report and Written Opinion for International Application No. PCT/US2022/017453, dated Jun. 9, 2022, 11 pages.

(Continued)

*Primary Examiner* — Joseph P Martinez
(74) *Attorney, Agent, or Firm* — Greenberg Traurig, LLP

(57) ABSTRACT

An actuator may be integrated into an optical element such as a liquid lens and configured to create spherical curvature as well as a variable cylinder radius and axis in a surface of the optical element. An example actuator may include a stack of electromechanical layers, and electrodes configured to apply an electric field independently across each of the electromechanical layers. Within the stack, an orientation of neighboring electromechanical layers may differ, e.g., stepwise, by at least approximately 10°.

20 Claims, 11 Drawing Sheets

(56) References Cited

OTHER PUBLICATIONS

Xia et al., "PVDF-based dielectric polymers and their applications in electronic materials", IET Nanodielectrics, vol. 1, No. 1, 2018, 17 pages.
Humphreys et al., "A Study of the Drawing Behavior of Polyvinylidene Fluoride", Journal of Applied Polymer Science, vol. 30, 1985, pp. 4069-4079.
Hartono et al., "Electric Field Poling 2G V/m to improve piezo-electricity of PVDF thin film", AIP Conference Proceedings, vol. 1719, Article 030021, Mar. 11, 2016, pp. 1-4.
Hartono et al., "Poly (vinylidene fluoride) Thin Film Prepared by Roll Hot Press", IOSR Journal of Applied Physics, vol. 3, No. 1, Jan.-Feb. 2013, 6 pages.
Yang et al., "Epitaxy Enhancement of Piezoelectric Properties in P(VDF-TrFE) Copolymer Films and Applications in Sensing and Energy Harvesting", Adv. Electron. Mater. vol. 6, Article 2000578, 14 pages.
Sessler, G.M., "Piezoelectricity in polyvinylidenefluoride", The Journal of the Acoustical Society of America, vol. 70, No. 6, Dec. 1981, 15 pages.
Shin et al., "Recent Advances in Organic Piezoelectric Biomaterials for Energy and Biomedical Applications", Nanomaterials, vol. 10, No. 123, 2020, 16 pages.

\* cited by examiner

ACTUATOR WITH VARIABLE CYLINDER

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
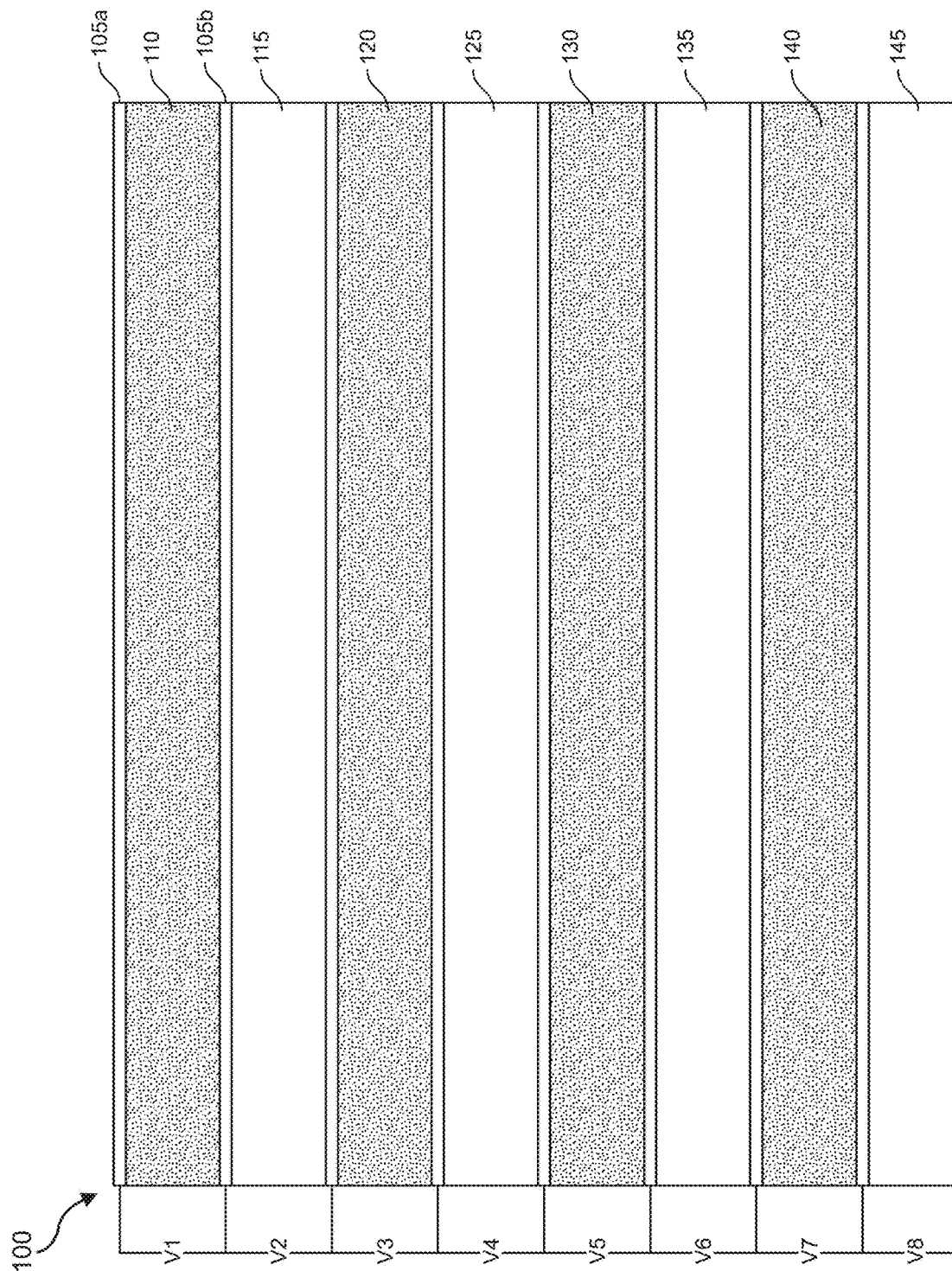
FIG. 1 shows a stacked actuator architecture including plural independently-electroded electromechanical layers for providing a variable cylinder radius and axis in a surface according to some embodiments.
Figure 2:
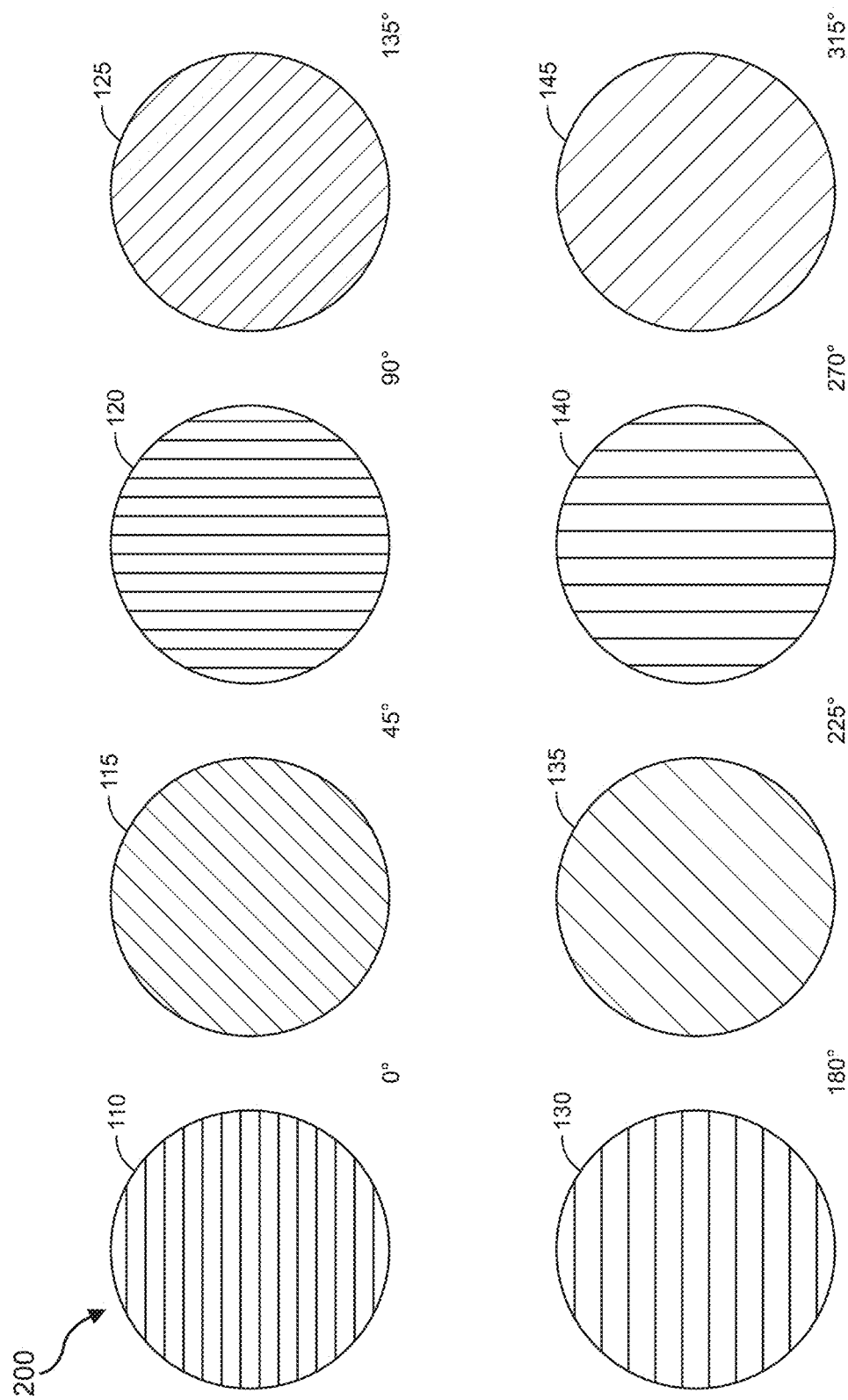
FIG. 2 depicts an orientational relationship of the plural electromechanical layers in the stacked actuator architecture of FIG. 1 according to certain embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

The fabrication of prescriptive lenses typically involves a casting process to generate a lens blank followed by milling or grinding and polishing to introduce customized, higher order curvature to at least one lens surface. Multiple such processing steps may increase the cost of manufacture, however, and inefficient production is especially an issue in ophthalmic lenses, where nearly 80% of the starting material may be lost to subtractive manufacture.

In certain applications, the effective cost of prescriptive lenses may be improved through the production of adjustable lenses, which may be worn by multiple users having different prescriptions. Adjustable lenses may allow multiple users to share a common optical element or device, such as an augmented reality or virtual reality device or headset.

With an adjustable lens, a lens profile may be tuned real-time or for a particular user to correct chromatic and monochromatic aberrations, including defocus, spherical aberrations, coma, astigmatism, field curvature, image distortions, and the like. The tuning of a lens may include the introduction of both spherical and cylinder curvature. As used herein, the curve on the surface of a spherical lens, if extrapolated in all directions, would form a sphere. A cylinder curve, on the other hand, is curved along a single axis and planar along a perpendicular axis such that, whereas the focus of a spherical curve is a single point, the focus of a cylinder curve is a line.

Many prescriptions include a combination of spherical and cylinder curves. A lens that includes both spherical and cylinder curves may be referred to as a compound lens or toric. Notwithstanding recent developments, it would be advantageous to provide compound lenses where adjustments to both sphere and cylinder (including a variable cylinder radius and axis) may be made at the point of use. In a related vein, it would be advantageous to provide optical elements having improved actuation characteristics, including a controllable, customizable, and robust deformation response in an optically transparent package.

As will be described in greater detail herein, the instant disclosure relates to actuatable and transparent multilayer optical elements and methods for forming such optical elements. The optical elements may include layers of an electroactive material where each layer is sandwiched between conductive electrodes. The disclosed optical elements, i.e., multilayer actuators, may be configured to exhibit commercially-relevant electromechanical properties, including deformation response, long-term reliability, and integration compatibility, as well as beneficial optical properties, including antireflection and transparency.

A dynamic actuator may be incorporated into a lens (or other optical element) and configured to create sphere as well as a variable cylinder radius and axis in the lens. In various embodiments, the actuator may include a stack of electromechanical layers with corresponding electrodes that are arranged to apply an electric field independently across each of the electromechanical layers. The electromechanical layers may have a biaxial or uniaxial orientation and may be positioned within the stack such that the actuation and displacement of selected layers produces a desired net displacement. In particular embodiments, an orientation of neighboring uniaxially-oriented electromechanical layers may differ, e.g., by at least approximately 10°.

In some embodiments, a multilayer actuator may be used to create axisymmetric deflections, including spherical or aspherical contributions to an overall deflection profile, as well as non-axisymmetric (e.g., asymmetric) deflections, including cylindrical, prismatic, tip/tilt, and/or freeform contributions, thus enabling the dynamic formation of a high-quality prescriptive lens or other optical element.

The electromechanical layers within the multilayer stack of such actuators may include various electroactive materials, including organic materials such as electrostrictive or piezoelectric polymers or inorganic materials such as shape memory alloys or piezoceramics. According to certain embodiments, piezoelectric polymers and ceramics may be characterized by the piezoelectric coefficients $d_{31}$ and $d_{32}$, which correlate the displacement of charge per unit area (i.e., volume change) with an applied stress (i.e., applied electric field).

Electroactive materials may change their shape under the influence of an electric field and have been investigated for use in various technologies, including actuation, sensing and/or energy harvesting. Lightweight and conformable, various electroactive polymers and ceramics may be incorporated into wearable devices and are attractive candidates for emerging technologies including virtual reality/augmented reality devices where a comfortable, adjustable form factor is desired.

As used herein, "electroactive" materials, including piezoelectric and electrostrictive materials may, in some examples, refer to materials that exhibit a change in size or shape when stimulated by an external electric field. In the presence of an electric field (E-field), an electroactive material may deform (e.g., compress, elongate, bend, etc.) according to the magnitude and direction of the applied field.

In accordance with various embodiments, when exposed to an external electric field, an accumulated displacement of ions within an electroactive ceramic, for example, may produce an overall strain (elongation) in the direction of the field. That is, positive ions may be displaced in the direction of the field and negative ions displaced in the opposite direction. In turn, the thickness of the electroactive ceramic may be decreased in one or more orthogonal directions, as characterized by the Poisson's ratio.

Generation of such a field may be accomplished, for example, by placing the electroactive material between two electrodes, i.e., a primary electrode and a secondary electrode, each of which is at a different potential. As the potential difference (i.e., voltage difference) between the electrodes is increased or decreased (e.g., from zero potential) the amount of deformation may also increase, principally along electric field lines. This deformation may achieve saturation when a certain electrostatic field strength has been reached. With no electrostatic field, the electroactive material may be in its relaxed state undergoing no induced deformation, or stated equivalently, no induced strain, either internal or external. In an example actuator, plural electromechanical layers may be individually electroded such that a multilayer structure includes alternating electrodes and electroactive layers.

In some instances, the physical origin of the compressive nature of many electroactive materials in the presence of an electrostatic field, being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive material, and on its elastic compliance. Compliance in this case is the change of strain with respect to stress or, equivalently, in more practical terms, the change in displacement with respect to force.

The optical element may be deformable from an initial state to a deformed state when a first voltage is applied between the primary electrode(s) and the secondary electrode(s) and may further be deformable to a second deformed state when a second voltage is applied between the primary electrode(s) and the secondary electrode(s). In some embodiments, the deformation response may include a mechanical response to the electrical input that varies over the spatial extent of the device, with the electrical input being applied between the primary electrode(s) and the secondary electrode(s). The mechanical response may be termed an actuation, and example devices or optical elements may be, or include, actuators.

In certain embodiments, a multilayer actuator may be located within the transparent aperture of an optical device such as a liquid lens, although the present disclosure is not particularly limited and may be applied in a broader context. By way of example, the optical element may be incorporated into an active grating, tunable lens, accommodative optical element, adaptive optics, etc. According to various embodiments, the optical element may be optically transparent.

As used herein, a material or element that is "transparent" or "optically transparent" may, for example, have a transmissivity within the visible light spectrum of at least approximately 70%, e.g., approximately 70, 80, 90, 95, 97, 98, 99, or 99.5%, including ranges between any of the foregoing values, and less than approximately 10% bulk haze, e.g., approximately 0.1, 0.2, 0.5, 1, 2, 4, 6, or 8% bulk haze, including ranges between any of the foregoing values. In accordance with some embodiments, a "fully transparent" material or element may have a transmissivity (i.e., optical transmittance) within the visible light spectrum of at least approximately 90%, e.g., approximately 90, 95, 97, 98, 99, or 99.5%, including ranges between any of the foregoing values, less than approximately 10% bulk haze, e.g., approximately 0.1, 0.2, 0.5, 1, 2, 4, 6, or 8% bulk haze, including ranges between any of the foregoing values, less than approximately 30% reflectivity, e.g., approximately 1, 2, 5, 10, 15, 20, or 25% reflectivity, including ranges between any of the foregoing values, and at least 70% optical clarity, e.g., approximately 70, 80, 90, 95, 97, 98, 99, or 99.5% optical clarity, including ranges between any of the foregoing values. Transparent and fully transparent materials will typically exhibit very low optical absorption and minimal optical scattering.

As used herein, the term "approximately" in reference to a particular numeric value or range of values may, in certain embodiments, mean and include the stated value as well as all values within 10% of the stated value. Thus, by way of example, reference to the numeric value "50" as "approximately 50" may, in certain embodiments, include values equal to 50±5, i.e., values within the range 45 to 55.

As used herein, the terms "haze" and "clarity" may refer to an optical phenomenon associated with the transmission of light through a material, and may be attributed, for example, to the refraction of light within the material, e.g., due to secondary phases or porosity and/or the reflection of light from one or more surfaces of the material. As will be appreciated by those skilled in the art, haze may be associated with an amount of light that is subject to wide angle scattering (i.e., at an angle greater than 2.5° from normal) and a corresponding loss of transmissive contrast, whereas clarity may relate to an amount of light that is subject to narrow angle scattering (i.e., at an angle less than 2.5° from normal) and an attendant loss of optical sharpness or "see through quality."

According to various embodiments, the electroactive layers may include a transparent polymer or ceramic material and the electrodes may each include one or more layers of any suitable conductive material, such as transparent conductive oxides (e.g., TCOs such as ITO), graphene, etc.

Example polymer materials forming electroactive polymers may include, without limitation, styrenes, polyesters, polycarbonates, epoxies and/or halogenated polymers. Additional example electroactive polymer materials may include silicone-based polymers, such as poly(dimethyl siloxane), and acrylic polymers, such as ethyl acrylate, butyl acrylate, octyl acrylate, ethoxyethoxy ethyl acrylate, chloromethyl acrylate, methacrylic acid, dimethacrylate oligomers, allyl glycidyl ether, fluorinated acrylates, cyanoacrylate or N-methylol acrylamide. Still further example electroactive polymer materials may include polyvinylidene fluoride (PVDF) or its co-polymers such as polyvinylidene fluoride-trifluoroethylene (PVDF-TrFE)), ter-polymers such as polyvinylidene fluoride-trifluoroethylene-chlorofluoroethylene (PVDF-TrFE-CFE), silicone acrylate polymers, and urethane polymers, as well as mixtures of any of the foregoing.

According to some embodiments, the electroactive polymer layer may be formed by depositing a polymer precursor composition containing a curable material, e.g., onto a substrate, and curing the polymer precursor to form a polymer matrix. The polymer precursor composition may be, or include, a liquid. In addition to the curable material, the polymer precursor composition may include one or more of a polymerization initiator, surfactant, emulsifier, and/or other additive(s) such as cross-linking agents. In some embodiments, various components of the polymer precursor composition may be combined into a single mixture and deposited simultaneously. Alternatively, the various components may be deposited individually (i.e., in succession), or in any suitable combination(s).

An anisotropic polymer thin film may be formed using a thin film orientation system configured to heat and stretch a polymer thin film in at least one in-plane direction in one or more distinct regions thereof. In some embodiments, a thin film orientation system may be configured to stretch a polymer thin film along only one in-plane direction.

According to further embodiments, an electroactive ceramic layer may include a transparent polycrystalline ceramic or a transparent single crystal material. In some embodiments, a polycrystalline electroactive ceramic may have a relative density of at least approximately 99%, e.g., 99%, 99.5%, 99.9%, 99.95%, 99.99%, 99.995%, or 99.999%, including ranges between any of the foregoing values, and an average grain size of at least approximately 300 nm, e.g., 300 nm, 400 nm, 500 nm, 1000 nm, or 2000 nm, including ranges between any of the foregoing values.

Example electroactive ceramics may include one or more ferroelectric ceramics, as well as solid solutions or mixtures thereof. Typically, ferroelectric materials are characterized by high dielectric permittivity values, where the temperature of the maximum real dielectric permittivity corresponds to the ferroelectric-paraelectric phase transition temperature. The so-called relaxor ferroelectrics, on the other hand, may exhibit a more elaborate dielectric response. Relaxor ferroelectrics may be characterized by (i) wide peaks in the temperature dependence of the dielectric permittivity, (ii) a frequency-dependent dielectric permittivity, where the temperature of the respective maxima for the real and imaginary components of the permittivity appear at different values, and (iii) a temperature of the maximum in the real dielectric permittivity that may be independent of the ferroelectric-paraelectric phase transition temperature.

The origin of relaxor behavior in ferroelectrics may be attributed to a positional disorder of cations on A or B sites of the perovskite blocks that delay the evolution of long-range polar ordering. Commonly, the localized disorder in relaxor compounds may be attributed to their complex and disordered chemical structure, where multiple atoms may substitute on one atomic site. In the example of lead magnesium niobium oxide, for instance, both magnesium and niobium can occupy the same position in the crystal lattice. As a further example, lead zirconate titanate (PZT) is a typical ferroelectric perovskite showing a conventional FE-PE phase transition. However, the partial substitution of different elements, such as lanthanum or samarium, may increase disorder within the material and induce relaxor characteristics. Moreover, in accordance with some embodiments, for some lanthanum or samarium concentrations, the distortion of the PZT crystalline lattice due to ion displacement may promote the formation of polar nanoregions (PNRs), which may inhibit the formation of long-range ferroelectric domains. For some compositions, polar nanoregions that are present under zero applied field may beneficially persist through an applied field of at least 2 V/micrometer, e.g., at least 0.5, 1, 1.5, or 2 V/micrometer, including ranges between any of the foregoing values, whereas other compositions having polar nanoregions under zero applied field (e.g., PLZT) may undergo a field-induced relaxor-to-ferroelectric phase transformation, which may adversely impact one or more optical properties.

In accordance with various embodiments, example electroactive ceramics may include one or more compositions from the relaxor-PT-based family, which includes binary compositions such as $Pb(Mg_{1/3}Nb_{2/3})O_3$—$PbTiO_3$ (PMN-PT), $Pb(Zn_{1/3}Nb_{2/3})O_3$—$PbTiO_3$ (PZN-PT), ternary crystals such as $Pb(Zn_{1/3}Nb_{2/3})O_3$—$PbTiO_3$—$BaTiO_3$ (PZN-PT-BT), and the like. Generally, lead-based relaxor materials may be represented by the formula $Pb(B1B2)O_3$, where B1 may include $Mg^{2+}$, $Zn^{2+}$, $Ni^{2+}$, $Sc^{3+}$, $Fe^{3+}$, $Yb^{3+}$, $In^{3+}$, etc. and B2 may include $Nb^{5+}$, $Ta^{6+}$, $W^{6+}$, etc., although other relaxor compositions are contemplated.

Further electroactive ceramic compositions include barium titanate, barium titanium zirconium oxide, barium titanium tin oxide, barium strontium titanium oxide, barium zirconium oxide, lead magnesium titanium oxide, lead magnesium niobium oxide, lead magnesium niobium titanium zirconium oxide, lead scandium niobium oxide, lead scandium tantalum oxide, lead iron niobium oxide, lead iron tantalum oxide, lead iron tungsten oxide, lead indium niobium oxide, lead indium tantalum oxide, lead lanthanum zirconium titanium oxide, lead ytterbium niobium oxide, lead ytterbium tantalum oxide, lead zinc tantalum oxide, lead zinc niobium oxide, lead zinc niobium titanium oxide, lead zinc niobium titanium zirconium oxide, bismuth magnesium niobium oxide, bismuth magnesium tantalum oxide, bismuth zinc niobium oxide, bismuth zinc tantalum oxide, potassium sodium niobate, and combinations thereof.

Electroactive materials, including polycrystalline ceramics, may be formed by powder processing. Densely-packed networks of high purity, ultrafine polycrystalline particles can be highly transparent and may be more mechanically robust in thin layers than their single crystal counterparts. For instance, optical grade PLZT having >99.9% purity may be formed using sub-micron (e.g., <2 μm) particles. Substitution via doping of $Pb^{2+}$ at A- and B-site vacancies with $La^{2+}$ and/or $Ba^{2+}$ may be used to increase the transparency of perovskite ceramics such as textured or un-textured PLZT, PZN-PT and PMN-PT.

As known to those skilled in the art, ultrafine particle precursors can be fabricated via wet chemical methods, such as chemical co-precipitation, sol-gel and gel combustion. Grinding, ball milling, planetary milling, etc. may be used to modify the size and/or shape of ceramic powders. Green bodies may be formed using tape casting, slip casting, or gel casting. High pressure and high temperature sintering via techniques such as conventional sintering, cold sintering, hot pressing, high pressure (HP) and hot isostatic pressure, spark plasma sintering, flash sintering, two-stage sintering, and microwave sintering, for example, may be used to improve the ceramic particle packing density. More than one of the previous techniques may be used in conjunction as understood by one skilled in the art, for example, to achieve initial densification by one process and final densification by a secondary process while controlling grain growth during sintering. Sintered ceramics may be cut to a desired final shape and thinning via lapping and/or polishing may be used to decrease surface roughness to achieve thin, highly optically transparent layers that are suitable for high displacement actuation.

In addition to the foregoing, single crystal ceramics may be formed, for example, using hydrothermal processing or by a Czochralski method to produce an oriented ingot, which may be cut along a specified crystal plane to produce wafers having a desired crystalline orientation. Further methods for forming single crystals include float zone, Bridgman, Stockbarger, chemical vapor deposition, physical vapor transport, solvothermal techniques, etc. A wafer may be thinned, e.g., via lapping or grinding, and/or polished, and transparent electrodes (e.g., a primary electrode and a secondary electrode) may be formed directly on the wafer, using chemical vapor deposition or a physical vapor deposition process such as sputtering or evaporation, for example. According to some embodiments, an electroactive ceramic layer may have an RMS surface roughness of less than approximately 50 nm, e.g., less than 50, 40, 30, 20, 10, or 5 nm, including ranges between any of the foregoing values. The electroactive ceramic may be poled to achieve a desired dipole alignment.

In certain embodiments, the electroactive ceramics disclosed herein may be substantially free of secondary phases, i.e., may contain less than approximately 1% by volume of any secondary phase, including porosity, e.g., less than 1%, less than 0.5%, less than 0.2%, less than 0.1%, less than 0.05%, less than 0.02%, less than 0.01%, less than 0.005%, less than 0.002%, or less than 0.001% by volume, including ranges between any of the foregoing values. In some embodiments, the disclosed electroactive ceramics may be birefringent, which may be attributable to the material having plural distinct domains (e.g., polar nanoregions) or regions of varying polarization having different refractive indices.

As used herein, the term "substantially" in reference to a given parameter, property, or condition may mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least approximately 90% met, at least approximately 95% met, or even at least approximately 99% met.

According to various embodiments, a relaxor ceramic may include discrete (localized) regions of polar, i.e., non-cubic, material in a matrix having cubic symmetry. According to some embodiments, the polar nanoregions may have at least one dimension (length, width, or depth) of less than approximately 100 nm, e.g., less than 100 nm, less than 50 nm, less than 40 nm, less than 30 nm, less than 20 nm, less than 10 nm, or less than 5 nm, including ranges between any of the foregoing values. Electroactive (relaxor) ceramics may, according to some embodiments, be characterized by cubic or pseudo-cubic symmetry.

In some embodiments, optical elements may include paired electrodes, which allow the creation of the electrostatic field that forces displacement of an intervening electroactive layer. In some embodiments, an "electrode," as used herein, may refer to an electrically conductive material, which may be in the form of a thin film or a layer. Electrodes may include relatively thin, electrically conductive metals or metal alloys and may be of a non-compliant or compliant nature.

An electrode may include one or more electrically conductive materials, such as a metal, a semiconductor (e.g., a doped semiconductor), carbon nanotubes, graphene, oxidized graphene, fluorinated graphene, hydrogenated graphene, other graphene derivatives, carbon black, transparent conductive oxides (TCOs, e.g., indium tin oxide (ITO), zinc oxide (ZnO), etc.), conducting polymers (e.g., PEDOT), or other electrically conducting materials. In some embodiments, the electrodes may include a metal such as aluminum, gold, silver, platinum, palladium, nickel, tantalum, tin, copper, indium, gallium, zinc, alloys thereof, and the like. Further example transparent conductive oxides include, without limitation, aluminum-doped zinc oxide, fluorine-doped tin oxide, indium-doped cadmium oxide, indium zinc oxide, indium zinc tin oxide, indium gallium tin oxide, indium gallium zinc oxide (IGZO), indium gallium zinc tin oxide, strontium vanadate, strontium niobate, strontium molybdate, and calcium molybdate.

Example electrodes may have a sheet resistance of less than approximately 5000 ohms/square. In some embodiments, the electrode or electrode layer may be self-healing, such that damage from local shorting of a circuit can be isolated. Suitable self-healing electrodes may include thin films of materials that deform or oxidize irreversibly upon Joule heating, such as, for example, aluminum.

In some embodiments, a primary electrode may overlap (e.g., overlap in a parallel direction) at least a portion of a secondary electrode. The primary and secondary electrodes may be generally parallel and spaced apart and separated by a layer of electroactive material. A tertiary electrode may overlap at least a portion of either the primary or secondary electrode.

An optical element may include a first electroactive layer, which may be disposed between a first pair of electrodes (e.g., the primary electrode and the secondary electrode). A second electroactive layer may be located adjacent to the optical element and may be disposed between a second pair of electrodes. In some embodiments, there may be an electrode that is common to both the first pair of electrodes and the second pair of electrodes.

In some embodiments, one or more electrodes may be optionally electrically interconnected, e.g., through a contact or schoopage layer, to a common electrode. In some embodiments, an optical element may have a first common electrode, connected to a first plurality of electrodes, and a second common electrode, connected to a second plurality of electrodes. In some embodiments, electrodes (e.g., one of a first plurality of electrodes and one of a second plurality of electrodes) may be electrically isolated from each other using an insulator, such as a dielectric layer. An insulator may include a material without appreciable electrical conductivity, and may include a dielectric material, such as, for example, transparent aluminum, an acrylate, or a silicone polymer.

In some applications, a transparent electroactive actuator used in connection with the principles disclosed herein may include a primary electrode, a secondary electrode, and an electroactive layer disposed between the primary electrode and the secondary electrode. In some embodiments, there may be one or more additional electrodes, and a common electrode may be electrically coupled to one or more of the additional electrodes. For example, a pair of actuators may be disposed in a stacked configuration, with a first common electrode coupled to a first plurality of electrodes, and a second common electrode electrically connected to a second plurality of electrodes. In some embodiments, a common electrode may be electrically coupled (e.g., electrically contacted at an interface having a low contact resistance) to one or more other electrode(s), e.g., a secondary electrode and a tertiary electrode located on either side of a primary electrode.

In some embodiments, electrodes may be flexible and/or resilient and may stretch, for example elastically, when an optical element undergoes deformation. In this regard, electrodes may include a metal such as aluminum, graphene, carbon nanotubes, nanowires, etc. In other embodiments, relatively rigid electrodes (e.g., electrodes including one or more transparent conducting oxides (TCOs) such as indium tin oxide (ITO) or indium gallium zinc oxide (IGZO)) may be used.

In some embodiments, the electrodes (e.g., the primary electrode and the secondary electrode) may have a thickness of approximately 0.35 nm to approximately 1000 nm, e.g., approximately 0.35, 0.5, 1, 2, 5, 10, 20, 50, 100, 200, 500, or 1000 nm, including ranges between any of the foregoing values, with an example thickness of approximately 10 nm to approximately 50 nm. In some embodiments, a common electrode may have a sloped shape, or may be a more complex shape (e.g., patterned or freeform). In some embodiments, a common electrode may be shaped to allow compression and expansion of an optical element or device during operation.

The electrodes in certain embodiments may have an optical transmissivity of at least approximately 50%, e.g., approximately 50%, approximately 60%, approximately 70%, approximately 80%, approximately 90%, approximately 95%, approximately 97%, approximately 98%, approximately 99%, or approximately 99.5%, including ranges between any of the foregoing values.

In some embodiments, the electrodes described herein (e.g., the primary electrode, the secondary electrode, or any other electrode including any common electrode) may be fabricated using any suitable process. For example, the electrodes may be fabricated using physical vapor deposition (PVD), chemical vapor deposition (CVD), atomic layer deposition (ALD), evaporation, spray-coating, spin-coating, dip-coating, screen printing, Gravure printing, ink jet printing, aerosol jet printing, doctor blading, and the like. In further aspects, the electrodes may be manufactured using a thermal evaporator, a sputtering system, stamping, etc.

In some embodiments, a layer of electroactive material may be deposited directly on to an electrode. In some embodiments, an electrode may be deposited directly on to the electroactive material. In some embodiments, electrodes may be prefabricated and attached to an electroactive material. For instance, a prefabricated electrode may be bonded to an electroactive layer by thermocompression, metallic bonding, or other wafer bonding technology, or by using an adhesive layer such as a pressure sensitive adhesive. Example pressure sensitive adhesives include various acrylate compounds. In further embodiments, an electrode may be deposited on a substrate, for example a glass substrate or flexible polymer film. In some embodiments, the electroactive material layer may directly abut an electrode. In some embodiments, there may be an insulating layer, such as a dielectric layer, between a portion of a layer of electroactive material and an electrode.

The electrodes may be used to affect large scale deformation, i.e., via full-area coverage, or the electrodes may be patterned to provide spatially localized stress/strain profiles. In particular embodiments, a deformable optical element and an electroactive layer may be co-integrated whereby the deformable optical element may itself be actuatable. In addition, various methods of forming optical elements are disclosed, including solution-based and solid-state deposition techniques.

For electroactive materials, particularly single crystal and polycrystalline piezoelectrics, optical absorption is characteristically low and transmissive losses are typically dominated by reflectivity. Moreover, piezoceramics and single crystal electroactive compositions typically have high refractive indices, which can substantially mismatch neighboring media resulting in surface reflections. Summarized in Table 1 are example materials that may be used for the electroactive layers, electrodes, passive support, as well as application specific layers.

TABLE 1

Example Multilayer Actuator Materials

|  | Material | Refractive Index |
|---|---|---|
| Electroactive | PVDF | 1.42 |
| Layers | PMN-PT | 2.4-2.6 |
|  | PZT | 2.4 |
| Electrodes | ITO | ~1.9 |
| Passive Support | Plastic | 1.4-1.6 |
|  | Glass | 1.4-1.9 |
|  | Sapphire | 1.7-1.8 |
| Liquid Lens Fluid | Polyphenyl ether (PPE) | 1.58 |
|  | Phenylated siloxane oil | 1.62 |

In order to mediate reflective losses and inhibit the creation of optical artifacts such as ghost images, example multilayer structures may further include a reflective or antireflective coating (ARC). According to various embodiments, a reflective or antireflective coating may be disposed over either or both electrodes (e.g., a primary antireflective coating may be formed over at least a portion of a surface of the primary electrode opposite to the electroactive layer and/or a secondary reflective or antireflective coating may be formed over at least a portion of a surface of the secondary electrode opposite to the electroactive layer).

The antireflective coating(s) may be optically transparent and accordingly exhibit less than 10% bulk haze and a transmissivity within the visible spectrum of at least 70%. For instance, an antireflective coating may be configured to maintain at least 70% transmissivity over $10^6$ actuation cycles and an induced engineering strain of up to approximately 1%. In some embodiments, the antireflective coating(s) may exhibit a reflectivity within the visible spectrum of less than approximately 30%.

Example antireflective coatings may include one or more dielectric layers, which may include a stoichiometric or non-stoichiometric oxide, fluoride, oxyfluoride, nitride, oxynitride, sulfide, including but not limited to $SiO_2$, $TiO_2$, $Al_2O_3$, $Y_2O_3$, $HfO_2$, $ZrO_2$, $Ta_2O_5$, $Cr_2O_3$, $AlF_3$, $MgF_2$, $NdF_3$, $LaF_3$, $YF_3$, $CeF_3$, $YbF_3$, $Si_3N_4$, ZnS, or ZnSe.

In some embodiments, an antireflective coating may be configured as a multilayer stack. A multilayer stack may include one or more dielectric layers, and in certain embodiments an antireflective coating may include a transparent electrode. That is, a primary electrode or a secondary electrode may be integrated into a multilayer antireflective coating.

In some embodiments, the anti-reflective coating may include combinations of one or more of the aforementioned oxides and/or one or more of the aforementioned fluorides. Example anti-reflective coatings may include: (a) one of the above-identified oxides, (b) one of the above-identified fluorides, (c) two of the above-identified oxides, (d) one of the above-identified oxides combined with one of the above-identified fluorides, (e) two of the above-identified oxides combined with one of the above-identified fluorides, (f) two of the above-identified oxides combined with two of the above-identified fluorides, or (g) three of the above-identified oxides. By way of example, a multilayer stack may include a layer of zinc oxide disposed directly over an electrode and a layer of silicon dioxide disposed over the layer of zinc oxide, although further combinations are contemplated.

In accordance with some embodiments, an antireflective coating may operate to gradually decrease the refractive index between that of the electroactive layer and an adjacent, typically lower index material. In various embodiments, an antireflective coating may include multiple layers of varying refractive index and/or one or more layers having a refractive index gradient.

An ARC layer may have any suitable thickness, including, for example, a thickness of approximately 10 nm to approximately 1000 nm, e.g., approximately 10, 20, 50, 100, 200, 500, or 1000 nm, including ranges between any of the foregoing values, with an example thickness range of approximately 50 nm to approximately 100 nm.

In various embodiments, the one or more layers within an antireflective coating may be fabricated using any suitable process. For example, the ARC layer(s) may be fabricated using physical vapor deposition (PVD), chemical vapor deposition (CVD), atomic layer deposition (ALD), evaporation, spray-coating, spin-coating, dip-coating, screen printing, Gravure printing, ink jet printing, aerosol jet printing, doctor blading, and the like.

In some embodiments, a multilayer actuator stack may include a barrier layer. A suitable barrier layer may operate as a functional coating adapted to decrease the transmittance therethrough of light and/or the transpiration therethrough of water, water vapor, or other liquids or gases. In certain embodiments, a barrier layer may be configured inhibit the permeation of water vapor to less than approximately $10^{-6}$ g/m$^2$/day and/or inhibit the permeation of oxygen to less than approximately $10^{-5}$ cm$^3$/m$^2$/day. According to further embodiments, a barrier layer may improve the mechanical robustness of a multilayer actuator, e.g., via crack blunting and/or vibration reduction. A barrier layer may be colorless, chemically inert, electrically insulating, and/or scratch resistant and may include various epoxy compounds. In some embodiments, an antireflective coating, e.g., one or more layers within a multilayer antireflective coating, may serve as a barrier layer.

A bonding layer, such as an optical adhesive, may be used to join adjacent layers within a multilayer structure. According to some embodiments, a bonding layer may include a pressure-sensitive adhesive (PSA) such as one or more acrylate-based polymers derived from soft monomers (i.e., low $T_g$ monomers for tack and flexibility), hard monomers (i.e., high $T_g$ monomers for cohesion strength) and functional monomers (e.g., for adhesion strength). Example PSA materials include 2-ethylhexyl acrylate (2-EHA), methyl methacrylate (MMA), butylacrylate, hexylacrylate, isooctylacrylate, 2-hydroxyethyl acrylate (2-HEA), lauryl acrylate (LA), acrylic acid (AA), 2-phenoxy ethyl acrylate (2-PEA), etc. In some embodiments, such acrylates may be functionalized with a cross linking agent, such as aluminum acetylacetonate (AlAcAc), zirconium acetylacetonate (ZrAcAc), hafnium carboxyethyl acrylate (HCA), and the like.

In some embodiments, the barrier layer and/or the bonding layer may include a double network tough adhesive (DNTA). A DNTA, which may be colorless and optically clear, may include a high-performance PSA with acid and epoxy functionalities combined with an acrylated urethane oligomer, a methacrylated silane thermoset cross-linker, and/or a photo-initiator (e.g., a metal chelate ionic cross-linker). A barrier layer and/or bonding layer, if provided, may be indexed-matched with the electroactive layer(s) to decrease internal reflection amongst the plural layers of a multilayer actuator.

In accordance with certain embodiments, an optical element such as a multilayer actuator may include a passive support, which may include a glass, ceramic, polymer or other dielectric composition. An example passive support may include sapphire. A passive support may influence the mechanical performance of the actuator including its stiffness and buckling response. In some embodiments, the support may include a planar, meniscus, or ophthalmic glass substrate. In some embodiments, a bonding layer may be used to affix the passive support to the actuator architecture.

In accordance with certain embodiments, a transparent actuator including an electroactive layer disposed between transparent electrodes may be incorporated into a variety of device architectures where capacitive actuation and the attendant strain realized in the electroactive layer (e.g., lateral expansion and compression in the direction of the applied electric field) may induce deformation in one or more adjacent active layers within the device and accordingly change the optical performance of the active layer(s). Lateral deformation may be essentially 1-dimensional, in the case of an anchored thin film, or 2-dimensional.

Insomuch as many piezoelectric ceramics and single crystals are limited to less than approximately 0.1% to approximately 2% strain before failure, electroactive actuators are commonly operated in a bending mode to achieve large displacements albeit with a compromise in force output. In an example bimorph bending mode actuator, alternating tensile and compressive stresses above and below a neutral plane may be used to generate bending motion. As such, multilayer structures with one or more electroactive layers may be used to achieve a desired stress (and strain) condition.

In certain applications, such as a liquid lens, where a high net displacement over a large surface area may be beneficial, the onset of buckling instabilities may decrease the accessible actuation range for some multilayer actuator geometries. Buckling may occur when a structure is loaded above a critical compressive stress, which for a transparent actuator is related to the stress induced via the indirect piezoelectric effect. According to some embodiments, however, the usable actuation range otherwise limited by a buckling instability may be improved through appropriate mechanical design, e.g., to increase the critical compressive stress of the electroactive layer(s).

In some embodiments, an optical device may include a liquid lens. As will be appreciated, in accordance with various embodiments, a liquid lens fitted with a multilayer actuator may provide varifocal accommodation with high see-through quality and effective actuation within a commercially-relevant form factor. That is, a liquid lens having a transparent multilayer actuator functioning as a deformable surface is an attractive solution to meet space constraints.

According to various embodiments, a multilayer actuator may include alternating electrode and electroactive material layers. The application of a voltage between respective electrode pairs can cause compression or expansion of the intervening electroactive layer in the direction of the applied electric field and an associated expansion or contraction of the electroactive layer in one or more transverse dimensions. In some embodiments, an applied voltage (e.g., to the primary electrode and/or the secondary electrode) may create at least approximately 0.02% strain in an electroactive layer (e.g., an amount of deformation in the direction of the applied force resulting from the applied voltage divided by the initial dimension of the material) in at least one direction (e.g., an x, y, or z direction with respect to a defined coordinate system).

An electrical signal may include a potential difference, which may include a direct or alternating voltage. In some embodiments, the frequency may be higher than the highest mechanical response frequency of the device, so that deformation may occur in response to the applied RMS electric field but with no appreciable oscillatory mechanical response to the applied frequency. The applied electrical signal may generate non-uniform constriction of the electroactive layers between the respective primary and secondary electrodes. A non-uniform electroactive response may include a curvature of a surface of the optical element, which may in some embodiments be a compound curvature.

In some embodiments, an optical device may include additional elements interleaved between electrodes, such as in a stacked configuration. For example, electrodes may form an interdigitated stack of electrodes, with alternate electrodes connected to a first common electrode and the remaining alternate electrodes connected to a second common electrode. An additional optical element may be disposed on the other side of a primary electrode. The additional optical element may overlap a first optical element. An additional electrode may be disposed abutting a surface of any additional optical element.

Aspects of the present disclosure relate to a multilayer actuator that may be configured to overlie and provide controllable deformation to an optical element such as a liquid lens. In particular embodiments, the actuator membrane can be used to independently control both a spherical and a cylindrical profile of the lens, including the creation of a variable cylinder radius and axis.

An example actuator may include a composite (stacked) architecture of two or more layers of an oriented electromechanical material. Each layer may be individually electroded and independently oriented in-plane where, for example, a difference in the inter-layer orientation of successive layers may be at least approximately 10°. An applied bias and the attendant actuation and strain response in one or more of the layers may provide a cumulative deformation of the actuator and a desired induced optical power in the lens.

The plural layers may include uniaxially-oriented piezoelectric or electrostrictive polymers such as PVDF and its co-polymers, or a variety of suitable uniaxially-oriented piezoelectric ceramics such as PMN-PT. Further example electro-mechanical materials may include uniaxially-oriented electroactive polymers. In certain embodiments, the multilayer actuator may be optically transparent. An optical adhesive, which may include a refractive index-matching material, may be used to bond the layers together.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-12, a detailed description of multilayer actuators suitable for forming spherical curvature as well as a variable cylinder radius and axis in a surface of an optical element. The discussion associated with FIGS. 1-10 relates to the architecture and operation of various example multilayer actuators. The discussion associated with FIGS. 11 and 12 relates to exemplary virtual reality and augmented reality devices that may include a multilayer actuator as disclosed herein.

Referring to FIG. 1, shown is an example multilayer actuator 100 having 8 independently electroded electroactive layers 110, 115, 120, 125, 130, 135, 140, 145. Each electroactive layer 110-145 is disposed between a corresponding electrode pair, e.g., primary electrode 105a and secondary electrode 105b respectively overlie and underlie electroactive layer 110. The paired electrodes are connected to a corresponding floating voltage source V1-V8.

According to some embodiments, one or more of the electroactive layers 110-145 may be characterized by an asymmetric in-plane mechanical response. That is, one or more of the electroactive layers 110-145 may be uniaxially oriented. In certain embodiments, the in-plane mechanical anisotropy of one or more of the electroactive layers 110-145 may be at least approximately 2, e.g., 2, 5, 10, or 20, including ranges between any of the foregoing values. As disclosed further herein, the plural electroactive layers 110-145 may be arranged to misalign their respective in-plane orientation.

Within a multilayer actuator, the orientation of each electroactive layer may be independently arranged to provide an individually-actuatable contribution to an overall deformation response. The angular registration of the plural electroactive layers for the 8-layer multilayer actuator of FIG. 1 is shown schematically in FIG. 2, where the heavy parallel lines indicate for each electroactive layer 110-145 the direction of greatest in-plane electromechanical response.

In some embodiments, each electroactive layer in a multilayer stack (e.g., layers 110-145) may be independently oriented and the angular offset between layers may be constant or variable. Referring to configuration 200, for example, the angular offset of each successive layer is 45°. However, in accordance with various embodiments, it will be appreciated that a different angular offset as well as a different total number of electroactive layers may be used.

By way of example, a multilayer actuator may include from 2 to 10 independently electroded (and independently actuatable) electroactive layers. For instance, a stacked multilayer actuator may include 2, 3, 4, 5, 6, 7, 8, 9, 10, or more electroactive layers, where an angular misorientation for any two neighboring electroactive layers may range from approximately 10° to approximately 90°, e.g., 10°, 15°, 20°, 25°, 30°35°, 40°, 45°, 50°, 55°, 60°, 65°, 70°, 75°, 80°, 85°, or 90°, including ranges between any of the foregoing values. The angular misorientation between neighboring electroactive layers may be constant or variable throughout the stack.

Figure 3:
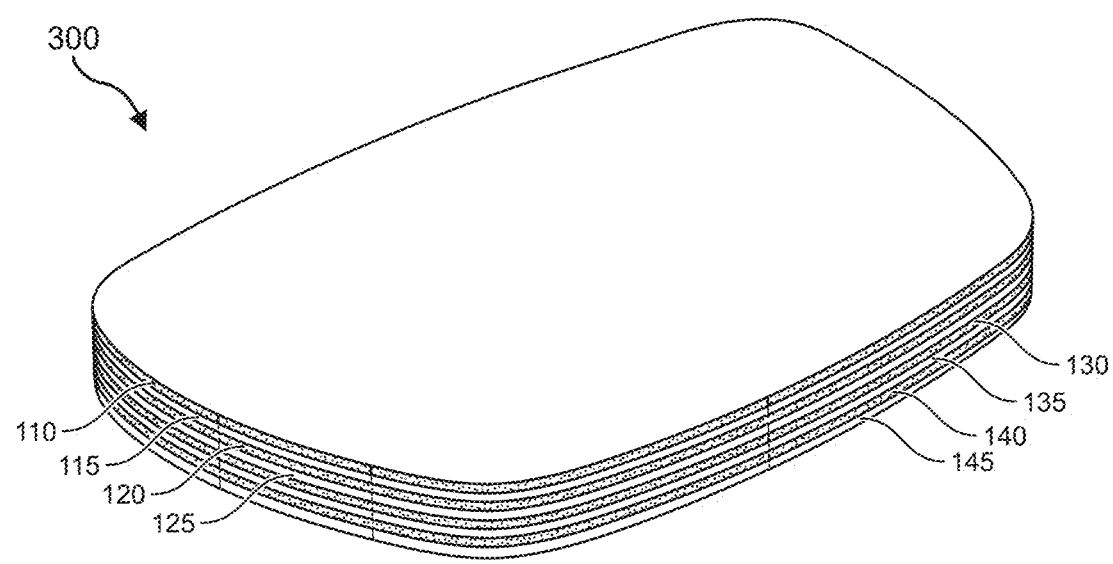
FIG. 3 is a perspective view of an optical element including the stacked actuator architecture of FIG. 1 according to some embodiments.

An example lens geometry including the multilayer actuator 100 of FIG. 1 is shown in FIG. 3. According to some embodiments, to generate a commercially-relevant form factor, the thickness of each electroactive layer 110-145 may be independently selected from within the range of approximately 30 micrometers to approximately 200 micrometers, e.g., 30, 40, 50, 60, 70, 80, 90, 100, 120, 140, 160, 180, or 200 micrometers, including ranges between any of the foregoing values.

Figure 4:
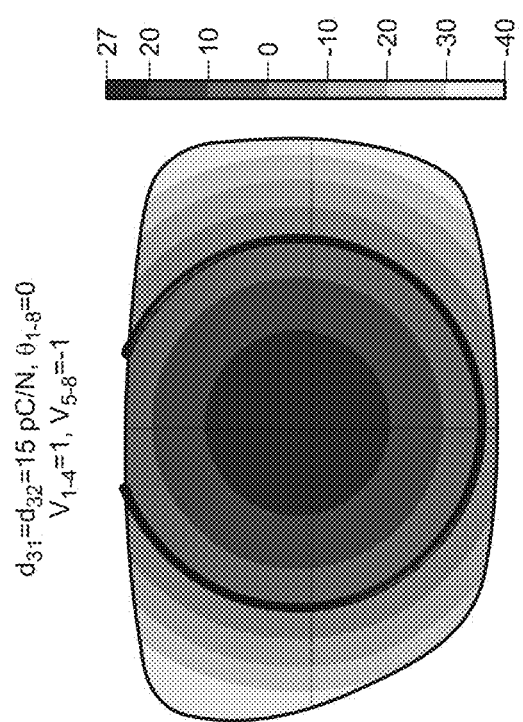
FIG. 4 is a contour plot showing the spherical displacement of a liquid lens integrated with a stacked actuator having plural biaxially-oriented electromechanical layers according to some embodiments.

Actuation and the attendant displacement of one or more layers within a stacked actuator may be used to generate a desired deformation in a surface of a lens or other optical element, including the introduction of sphere and/or cylinder profiles. Referring to FIG. 4, shown is a contour plot of relative displacement (in micrometers) of a lens surface. In the example of FIG. 4, each of the 8 electroactive layers in the multilayer actuator includes biaxially oriented PVDF ($d_{31}=d_{32}=15$ pC/N). A positive relative bias (V=+1) is applied to layers 1-4 and an equal but opposing negative relative bias (V=−1) is applied to layers 5-8. Deformation consistent with the inducement of a spherical profile is observed.

Figure 5:
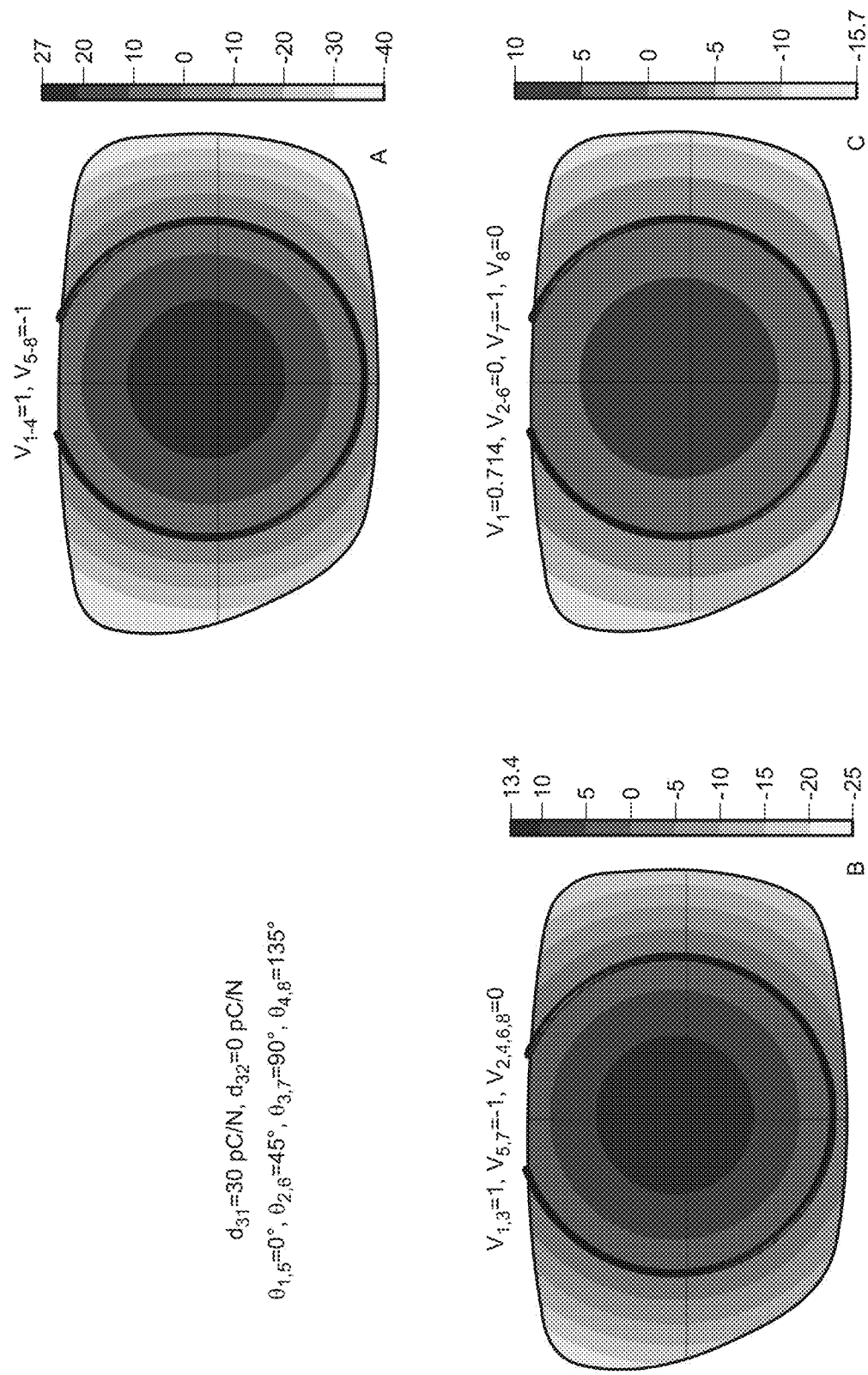
FIG. 5 shows contour plots for different actuation conditions and the resulting spherical displacement of liquid lenses integrated with example stacked actuators having uniaxially-oriented electromechanical layers according to some embodiments.

In addition to the isotropic case of FIG. 4, a spherical profile may be generated in a lens surface using alternate actuator configurations and biasing paradigms. Turning to FIG. 5, spherical profiles may be generated using a multi-layer actuator stack that includes 8 layers of a uniaxially oriented piezoelectric material ($d_{31}=30$ pC/N; $d_{32}=0$ pC/N) where the orientation of successive layers is stepped at a 45° interval, as illustrated schematically in FIG. 2.

The spherical profile shown in FIG. 5A corresponds to a positive relative bias (V=+1) applied to layers 1-4, and a negative relative bias (V=−1) applied to layers 5-8. The spherical profile shown in FIG. 5B corresponds to a positive relative bias (V=+1) applied to layers 1 and 3, a negative relative bias (V=−1) applied to layers 5 and 7, a no bias applied to layers 2, 4, 6, and 8. The spherical profile shown in FIG. 5C corresponds to a positive relative bias (V=0.714) applied to layer 1, a negative relative bias (V=−1) applied to layer 7, a no bias applied to layers 2, 3, 4, 5, 6, and 8.

Figure 6:
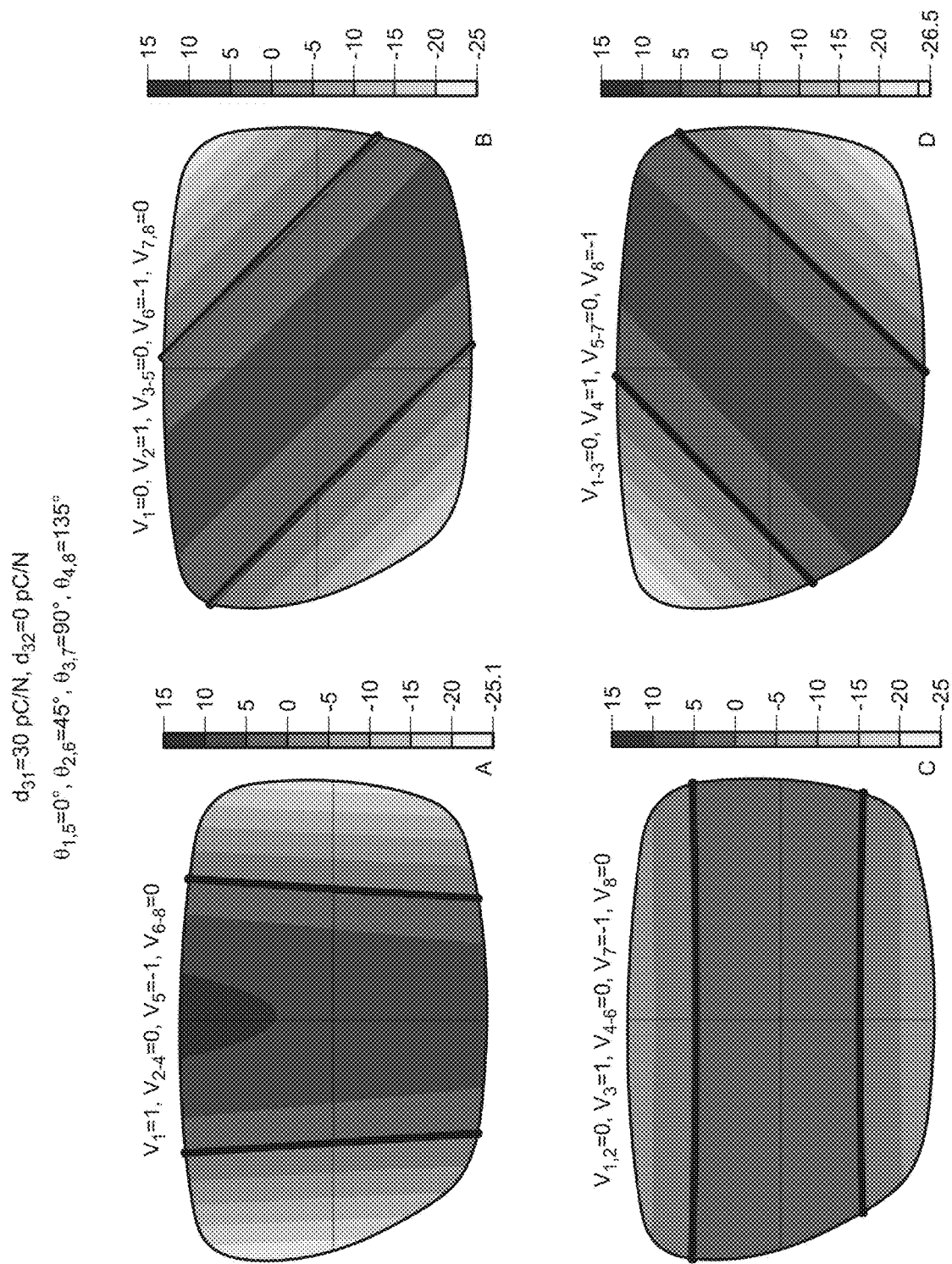
FIG. 6 shows for various actuation conditions the inducement of cylindrical deformation in example liquid lenses integrated with stacked actuators having uniaxially-oriented electromechanical layers according to certain embodiments.
Figure 7:
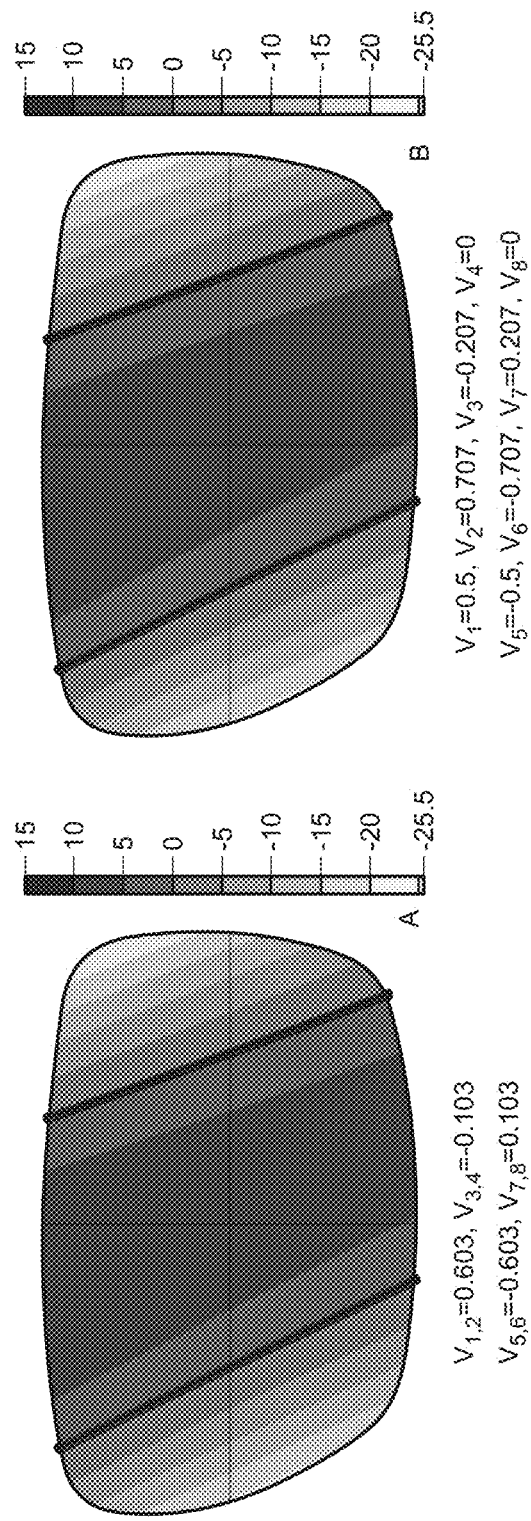
FIG. 7 shows for different actuation conditions the inducement of cylindrical deformation in example liquid lenses using stacked actuators having uniaxially-oriented electromechanical layers according to further embodiments.

Referring to FIGS. 6 and 7, shown are cylinder profiles having variable radius and axis. As in the previous embodiments, the multilayer actuator stack used to generate cylinder includes 8 layers of a uniaxially oriented piezoelectric material ($d_{31}=30$ pC/N; $d_{32}=0$ pC/N) where successive layers are oriented at a step of 45°.

Referring to FIG. 6A, a cylinder profile is generated by applying a positive relative bias (V=+1) to layer 1 and a negative relative bias (V=−1) to layer 5. The cylinder profile of FIG. 6A has an axis aligned 90° with respect to the horizontal. Referring to FIG. 6B, applying a positive relative bias (V=+1) and a negative relative bias (V=−1) to layers 2 and 6, respectively, may be used to create a cylindrical lens profile with an axis oriented at 135° with respect to the horizontal. Referring to FIG. 6C, applying a positive relative bias (V=+1) and a negative relative bias (V=−1) to layers 3 and 7, respectively, may be used to create a cylindrical lens having a horizontal axis. Referring to FIG. 6D, applying a positive relative bias (V=+1) and a negative relative bias (V=−1) to layers 4 and 8, respectively, may be used to create a cylindrical lens with an axis oriented at 45° with respect to the horizontal.

As illustrated in the contour plots of FIG. 7, lens profiles having arbitrary cylinder orientations may be achieved. For instance, referring to FIG. 7A, a cylindrical lens profile oriented at an angle of 67.5° with respect to the horizontal axis may be obtained by applying a positive relative bias (V=0.603) to layers 1 and 2, a negative relative bias (V=−0.103) to layers 3 and 4, a negative relative bias (V=−0.603) to layers 5 and 6, and a positive relative bias (V=0.103) to layers 7 and 8. Referring to FIG. 7B, a similarly shaped cylindrical profile may be obtained by alternately applying a relative bias of 0.5, 0.707, −0.207, 0, −0.5, −0.707, 0.207, and 0 to layers 1-8, respectively.

In some embodiments, a cylinder profile may have a radius of curvature ranging from approximately −1 m to approximate 1 m, e.g., −1, −0.5, −0.2, −0.1, 0.1, 0.2, 0.5, or 1 m, including ranges between any of the foregoing values.

As will be appreciated, although the foregoing examples illustrate the generation of pure spherical and cylindrical deformations, combinations of sphere and cylinder may be generated by applying combinations (e.g., linear combinations) of the voltages used to generate sphere and cylinder separately.

In some embodiments, a multilayer actuator may include one or more passive layers, which may, for example, provide mechanical support to the actuator or an associated optical element. A passive layer may be integrated into the stack of alternating electrodes and active electroactive layers. Additionally or alternatively, a passive layer may be disposed over one or both major surfaces of a multilayer actuator.

Figure 8:
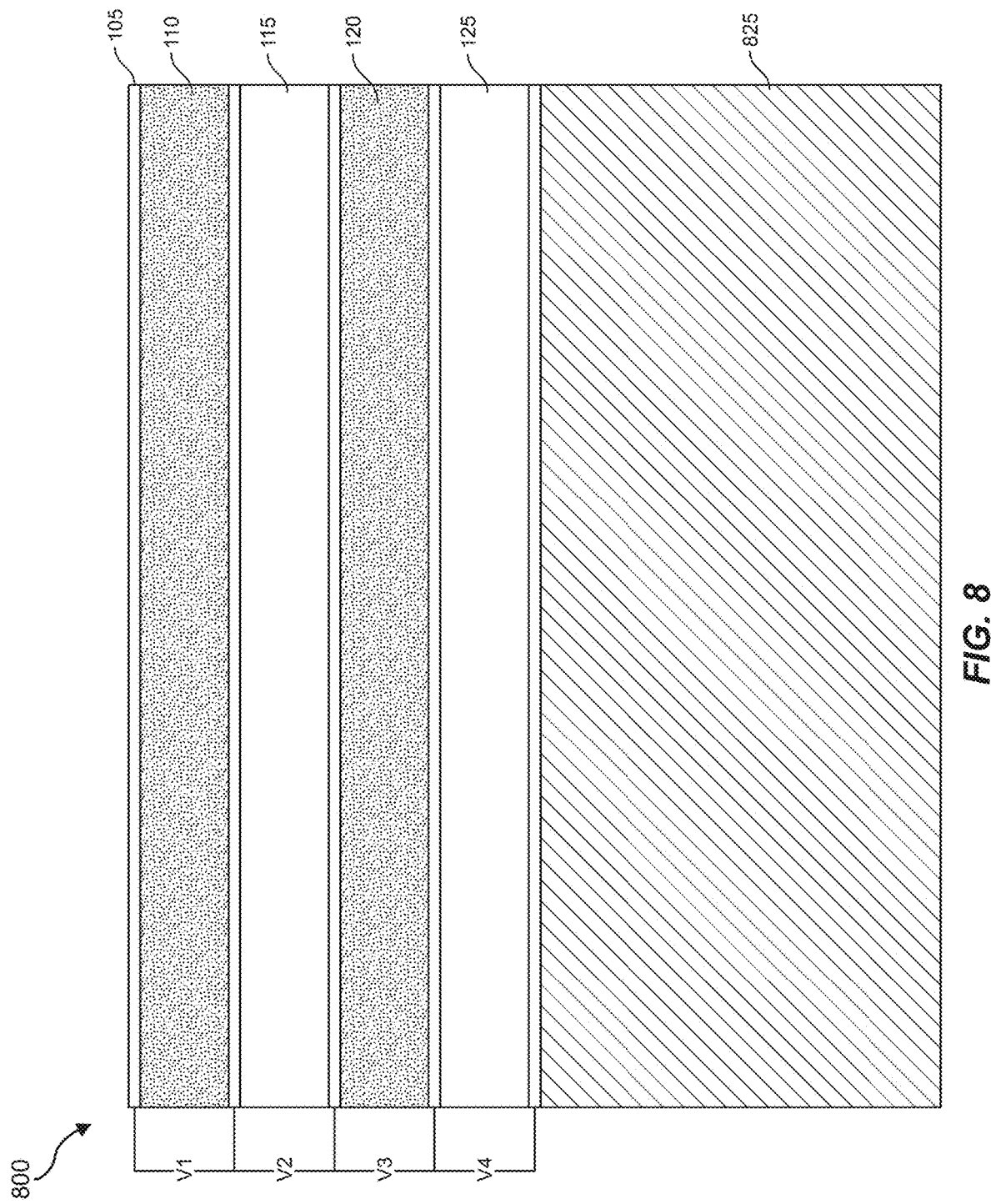
FIG. 8 shows a stacked actuator architecture including an inactive layer for providing a variable cylinder radius and axis in a surface according to some embodiments.

Referring to FIG. 8, shown is an example multilayer actuator having a passive layer. Actuator 800 includes plural anisotropic and individually electroded electroactive layers 110, 115, 120, and 125 where the electrode pair for each electroactive layer may be driven by a corresponding voltage source V1, V2, V3, V4. Actuator 800 further includes a passive layer 825 bonded to the multilayer stack. Passive layer 825 may include one or more suitable polymer, glass, or ceramic compositions. For instance, passive layer may include an elastomer, acrylate, or one or more electroactive materials as disclosed herein.

Figure 9:
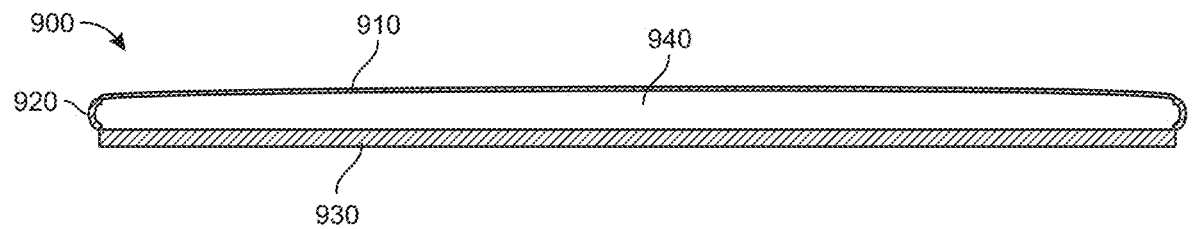
FIG. 9 is a cross-sectional view of a liquid lens integrated with a stacked actuator architecture for providing a variable cylinder radius and axis in a surface of the liquid lens according to some embodiments.

An example liquid lens is shown in FIG. 9. Liquid lens 900 may be configured for one or more artificial reality applications, and may include a multilayer actuator 910 (e.g., actuator 100), an edge seal 920 located between the actuator 910 and a passive support 930, and a lens fluid 940 disposed between the actuator 910 and the support 930 and contained by the edge seal 920. In the illustrated lens 900, multilayer actuator 910 may directly overly lens fluid 940.

In accordance with some embodiments, a liquid lens may include a substrate, an actuator overlying the substrate, a liquid layer disposed between the substrate and the actuator, and a seal located between the substrate and the actuator peripheral to the liquid layer, where the actuator is configured to create a variable cylinder radius and axis in a surface of the liquid layer. In such a liquid lens, the actuator may include a stack of electromechanical layers and electrodes configured to apply an electric field independently across each of the electromechanical layers, where an orientation of neighboring electromechanical layers differs by at least approximately 10°.

Figure 10:
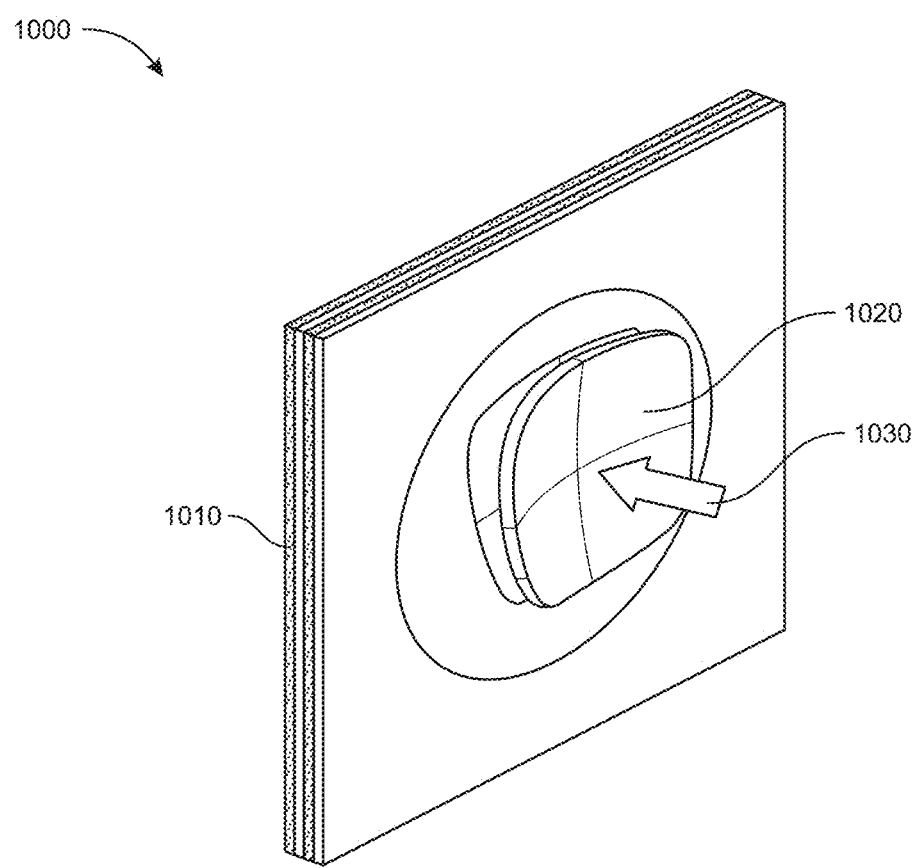
FIG. 10 illustrates an example method of forming an optical element having a stacked actuator according to some embodiments.

Referring to FIG. 10, in an example method 1000, an actuator 1010 and a transparent substrate 1020 may be aligned, laid up, and bonded together using a suitable adhesive through the application of pressure 1030, which may be applied to either or both the actuator 1010 and the substrate 1020. Suitable adhesives may include acrylic monomers, radiation curable materials, and thermally curable adhesives such as epoxies, urethanes, thermally initiated acrylates, and the like. Example adhesives may include a liquid solvent, which may be removed via diffusion after bonding. Pressure 1030 may be applied mechanically such as through a frame (not shown) holding the actuator 1010 and/or using fluids such as vacuum or pressurized air.

The multilayer actuator 1010 may conform to a surface of the substrate 1020. A surface of the substrate 1020 may include any suitable shape, including planar and non-planar geometries. A substrate may include simple or complex curvature, and may include one or more regions that are convex or concave, spherical, aspherical, cylindrical, or having more complex profiles that may be represented, for example, by Zernike polynomials.

In accordance with further embodiments, a method includes forming an actuator over a transparent substrate, the actuator including a stack of electromechanical layers and electrodes configured to apply an electric field independently across each of the electromechanical layers, where an orientation of neighboring electromechanical layers differs by at least approximately 10°, dispensing a liquid layer between the actuator and the substrate, and applying a voltage to at least one of the electrodes to create a variable cylinder radius and axis in a surface of the liquid layer. In some embodiments, a different voltage may be applied to different ones of the electrodes. Such an actuator may also create a spherical profile in the surface of the liquid layer.

EXAMPLE EMBODIMENTS

Example 1: An actuator includes a stack of electromechanical layers and electrodes configured to apply an electric field independently across each of the electromechanical layers, where an orientation of neighboring electromechanical layers differs by at least approximately 10°.

Example 2: The actuator of Example 1, where the stack of electromechanical layers is configured to create a variable cylinder radius and axis in a surface adjacent to the actuator.

Example 3: The actuator of Example 2, where the cylinder radius ranges from approximately −1 m to +1 m.

Example 4: The actuator of any of Examples 1-3, where one or more of the electromechanical layers include a uniaxially oriented material.

Example 5: The actuator of any of Examples 1-4, where the electromechanical layers include an electrostrictive material.

Example 6: The actuator of any of Examples 1-5, where the electromechanical layers include a piezoelectric material.

Example 7: The actuator of any of Examples 1-6, where the electromechanical layers include polyvinylidene fluoride.

Example 8: The actuator of any of Examples 1-7, where the electromechanical layers are optically transparent.

Example 9: The actuator of any of Examples 1-8, where the electrodes are arranged within the stack of electromechanical layers with a respective electrode located between each pair of the neighboring electromechanical layers.

Example 10: The actuator of any of Examples 1-9, where the electrodes are optically transparent.

Example 11: The actuator of any of Examples 1-10, further including a reflective layer overlying the stack of electromechanical layers.

Example 12: The actuator of any of Examples 1-11, further including a passive layer bonded to the stack of electromechanical layers.

Example 13: A liquid lens including the actuator of any of Examples 1-12.

Example 14: A liquid lens includes a substrate, an actuator overlying the substrate, a liquid layer disposed between the substrate and the actuator, and a seal located between the substrate and the actuator peripheral to the liquid layer, where the actuator is configured to create a variable cylinder radius and axis in a surface of the liquid layer.

Example 15: The liquid lens of Example 14, where the actuator directly overlies the liquid layer.

Example 16: The liquid lens of any of Examples 14 and 15, where the actuator includes a stack of electromechanical layers, and electrodes configured to apply an electric field independently across each of the electromechanical layers, where an orientation of neighboring electromechanical layers differs by at least approximately 10°.

Example 17: The liquid lens of Example 16, where the electromechanical layers each include a uniaxially oriented piezoelectric material.

Example 18: A method includes forming an actuator over a transparent substrate, the actuator including a stack of electromechanical layers and electrodes configured to apply an electric field independently across each of the electromechanical layers, where an orientation of neighboring electromechanical layers differs by at least approximately 10°, dispensing a liquid layer between the actuator and the substrate, and applying a voltage to at least one of the electrodes to create a variable cylinder radius and axis in a surface of the liquid layer.

Example 19: The method of Example 18, where applying the voltage creates a spherical profile in the surface of the liquid layer.

Example 20: The method of any of Examples 18 and 19, where the electrodes include a first electrode and a second electrode, and the method further includes applying a first voltage to the first electrode and applying a second voltage to the second electrode.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 1100 in FIG. 11) or that visually immerses a user in an artificial reality (such as, e.g., virtual-reality system 1200 in FIG. 12). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 11:
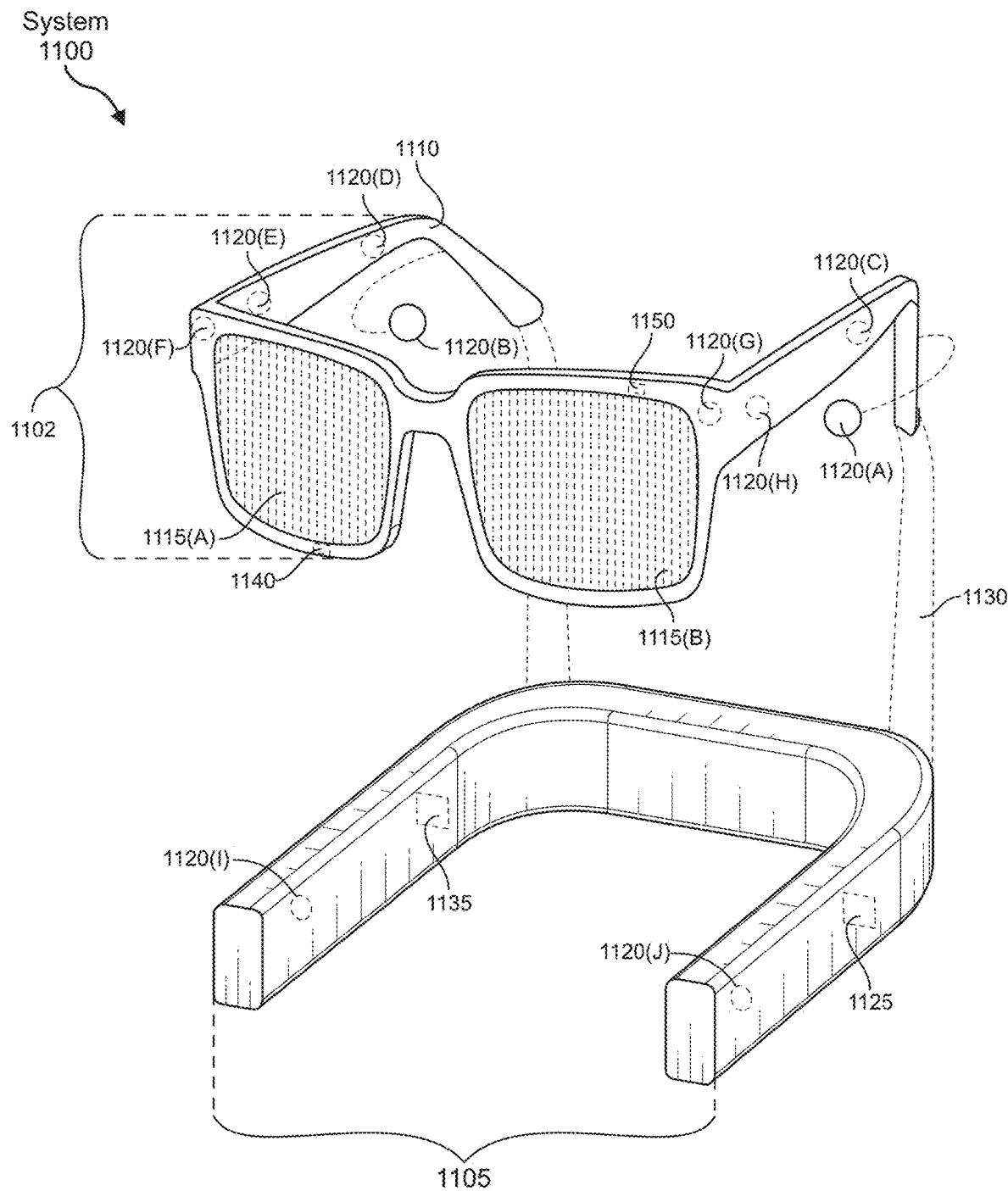
FIG. 11 is an illustration of exemplary augmented-reality glasses that may be used in connection with embodiments of this disclosure.
Figure 12:
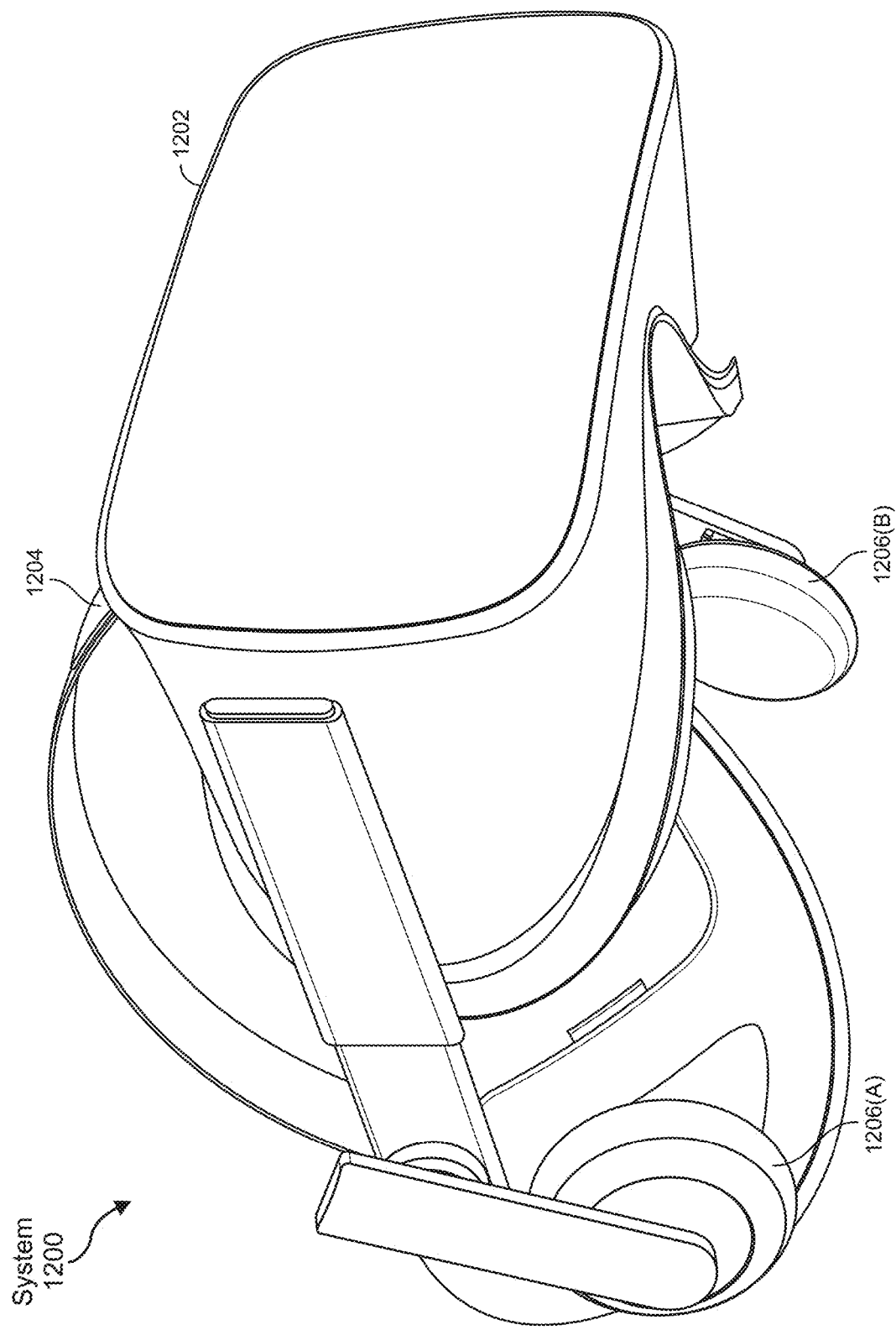
FIG. 12 is an illustration of an exemplary virtual-reality headset that may be used in connection with embodiments of this disclosure.

Turning to FIG. 11, augmented-reality system 1100 may include an eyewear device 1102 with a frame 1110 configured to hold a left display device 1115(A) and a right display device 1115(B) in front of a user's eyes. Display devices 1115(A) and 1115(B) may act together or independently to present an image or series of images to a user. While augmented-reality system 1100 includes two displays, embodiments of this disclosure may be implemented in augmented-reality systems with a single NED or more than two NEDs.

In some embodiments, augmented-reality system 1100 may include one or more sensors, such as sensor 1140. Sensor 1140 may generate measurement signals in response to motion of augmented-reality system 1100 and may be located on substantially any portion of frame 1110. Sensor 1140 may represent one or more of a variety of different sensing mechanisms, such as a position sensor, an inertial measurement unit (IMU), a depth camera assembly, a structured light emitter and/or detector, or any combination thereof. In some embodiments, augmented-reality system 1100 may or may not include sensor 1140 or may include more than one sensor. In embodiments in which sensor 1140 includes an IMU, the IMU may generate calibration data based on measurement signals from sensor 1140. Examples of sensor 1140 may include, without limitation, accelerometers, gyroscopes, magnetometers, other suitable types of sensors that detect motion, sensors used for error correction of the IMU, or some combination thereof.

In some examples, augmented-reality system 1100 may also include a microphone array with a plurality of acoustic transducers 1120(A)-1120(J), referred to collectively as acoustic transducers 1120. Acoustic transducers 1120 may represent transducers that detect air pressure variations induced by sound waves. Each acoustic transducer 1120 may be configured to detect sound and convert the detected sound into an electronic format (e.g., an analog or digital format). The microphone array in FIG. 11 may include, for example, ten acoustic transducers: 1120(A) and 1120(B), which may be designed to be placed inside a corresponding ear of the user, acoustic transducers 1120(C), 1120(D), 1120(E), 1120(F), 1120(G), and 1120(H), which may be positioned at various locations on frame 1110, and/or acoustic transducers 1120(I) and 1120(J), which may be positioned on a corresponding neckband 1105.

In some embodiments, one or more of acoustic transducers 1120(A)-(J) may be used as output transducers (e.g., speakers). For example, acoustic transducers 1120(A) and/or 1120(B) may be earbuds or any other suitable type of headphone or speaker.

The configuration of acoustic transducers 1120 of the microphone array may vary. While augmented-reality system 1100 is shown in FIG. 11 as having ten acoustic transducers 1120, the number of acoustic transducers 1120 may be greater or less than ten. In some embodiments, using higher numbers of acoustic transducers 1120 may increase the amount of audio information collected and/or the sensitivity and accuracy of the audio information. In contrast, using a lower number of acoustic transducers 1120 may decrease the computing power required by an associated controller 1150 to process the collected audio information. In addition, the position of each acoustic transducer 1120 of the microphone array may vary. For example, the position of an acoustic transducer 1120 may include a defined position on the user, a defined coordinate on frame 1110, an orientation associated with each acoustic transducer 1120, or some combination thereof.

Acoustic transducers 1120(A) and 1120(B) may be positioned on different parts of the user's ear, such as behind the pinna, behind the tragus, and/or within the auricle or fossa. Or, there may be additional acoustic transducers 1120 on or surrounding the ear in addition to acoustic transducers 1120 inside the ear canal. Having an acoustic transducer 1120 positioned next to an ear canal of a user may enable the microphone array to collect information on how sounds arrive at the ear canal. By positioning at least two of acoustic transducers 1120 on either side of a user's head (e.g., as binaural microphones), augmented-reality device 1100 may simulate binaural hearing and capture a 3D stereo sound field around about a user's head. In some embodiments, acoustic transducers 1120(A) and 1120(B) may be connected to augmented-reality system 1100 via a wired connection 1130, and in other embodiments acoustic transducers 1120(A) and 1120(B) may be connected to augmented-reality system 1100 via a wireless connection (e.g., a BLUETOOTH connection). In still other embodiments, acoustic transducers 1120(A) and 1120(B) may not be used at all in conjunction with augmented-reality system 1100.

Acoustic transducers 1120 on frame 1110 may be positioned in a variety of different ways, including along the length of the temples, across the bridge, above or below display devices 1115(A) and 1115(B), or some combination thereof. Acoustic transducers 1120 may also be oriented such that the microphone array is able to detect sounds in a wide range of directions surrounding the user wearing the augmented-reality system 1100. In some embodiments, an optimization process may be performed during manufacturing of augmented-reality system 1100 to determine relative positioning of each acoustic transducer 1120 in the microphone array.

In some examples, augmented-reality system 1100 may include or be connected to an external device (e.g., a paired device), such as neckband 1105. Neckband 1105 generally represents any type or form of paired device. Thus, the following discussion of neckband 1105 may also apply to various other paired devices, such as charging cases, smart watches, smart phones, wrist bands, other wearable devices, hand-held controllers, tablet computers, laptop computers, other external compute devices, etc.

As shown, neckband 1105 may be coupled to eyewear device 1102 via one or more connectors. The connectors may be wired or wireless and may include electrical and/or non-electrical (e.g., structural) components. In some cases, eyewear device 1102 and neckband 1105 may operate independently without any wired or wireless connection between them. While FIG. 11 illustrates the components of eyewear device 1102 and neckband 1105 in example locations on eyewear device 1102 and neckband 1105, the components may be located elsewhere and/or distributed differently on eyewear device 1102 and/or neckband 1105. In some embodiments, the components of eyewear device 1102 and neckband 1105 may be located on one or more additional peripheral devices paired with eyewear device 1102, neckband 1105, or some combination thereof.

Pairing external devices, such as neckband 1105, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1100 may be provided by a paired device or shared between a paired device and an eyewear device, thus reducing the weight, heat profile, and form factor of the eyewear device overall while still retaining desired functionality. For example, neckband 1105 may allow components that would otherwise be included on an eyewear device to be included in neckband 1105 since users may tolerate a heavier weight load on their shoulders than they would tolerate on their heads. Neckband 1105 may also have a larger surface area over which to diffuse and disperse heat to the ambient environment. Thus, neckband 1105 may allow for greater battery and computation capacity than might otherwise have been possible on a stand-alone eyewear device. Since weight carried in neckband 1105 may be less invasive to a user than weight carried in eyewear device 1102, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 1105 may be communicatively coupled with eyewear device 1102 and/or to other devices. These other devices may provide certain functions (e.g., tracking, localizing, depth mapping, processing, storage, etc.) to augmented-reality system 1100. In the embodiment of FIG. 11, neckband 1105 may include two acoustic transducers (e.g., 1120(I) and 1120(J)) that are part of the microphone array (or potentially form their own microphone subarray). Neckband 1105 may also include a controller 1125 and a power source 1135.

Acoustic transducers 1120(I) and 1120(J) of neckband 1105 may be configured to detect sound and convert the detected sound into an electronic format (analog or digital). In the embodiment of FIG. 11, acoustic transducers 1120(I) and 1120(J) may be positioned on neckband 1105, thereby increasing the distance between the neckband acoustic transducers 1120(I) and 1120(J) and other acoustic transducers 1120 positioned on eyewear device 1102. In some cases, increasing the distance between acoustic transducers 1120 of the microphone array may improve the accuracy of beamforming performed via the microphone array. For example, if a sound is detected by acoustic transducers 1120(C) and 1120(D) and the distance between acoustic transducers 1120(C) and 1120(D) is greater than, e.g., the distance between acoustic transducers 1120(D) and 1120(E), the determined source location of the detected sound may be more accurate than if the sound had been detected by acoustic transducers 1120(D) and 1120(E).

Controller 1125 of neckband 1105 may process information generated by the sensors on neckband 1105 and/or augmented-reality system 1100. For example, controller 1125 may process information from the microphone array that describes sounds detected by the microphone array. For each detected sound, controller 1125 may perform a direction-of-arrival (DOA) estimation to estimate a direction from which the detected sound arrived at the microphone array. As the microphone array detects sounds, controller 1125 may populate an audio data set with the information. In embodiments in which augmented-reality system 1100 includes an inertial measurement unit, controller 1125 may compute all inertial and spatial calculations from the IMU located on eyewear device 1102. A connector may convey information between augmented-reality system 1100 and neckband 1105 and between augmented-reality system 1100 and controller 1125. The information may be in the form of optical data, electrical data, wireless data, or any other transmittable data form. Moving the processing of information generated by augmented-reality system 1100 to neckband 1105 may reduce weight and heat in eyewear device 1102, making it more comfortable to the user.

Power source 1135 in neckband 1105 may provide power to eyewear device 1102 and/or to neckband 1105. Power source 1135 may include, without limitation, lithium ion batteries, lithium-polymer batteries, primary lithium batteries, alkaline batteries, or any other form of power storage. In some cases, power source 1135 may be a wired power source. Including power source 1135 on neckband 1105 instead of on eyewear device 1102 may help better distribute the weight and heat generated by power source 1135.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1200 in FIG. 12, that mostly or completely covers a user's field of view. Virtual-reality system 1200 may include a front rigid body 1202 and a band 1204 shaped to fit around a user's head. Virtual-reality system 1200 may also include output audio transducers 1206(A) and 1206(B). Furthermore, while not shown in FIG. 12, front rigid body 1202 may include one or more electronic elements, including one or more electronic displays, one or more inertial measurement units (IMUS), one or more tracking emitters or detectors, and/or any other suitable device or system for creating an artificial-reality experience.

Artificial-reality systems may include a variety of types of visual feedback mechanisms. For example, display devices in augmented-reality system 1100 and/or virtual-reality system 1200 may include one or more liquid crystal displays (LCDs), light emitting diode (LED) displays, microLED displays, organic LED (OLED) displays, digital light project (DLP) micro-displays, liquid crystal on silicon (LCoS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial-reality systems described herein may include one or more projection systems. For example, display devices in augmented-reality system 1100 and/or virtual-reality system 1200 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, augmented-reality system 1100 and/or virtual-reality system 1200 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to an electrostrictive ceramic that comprises or includes PMN-PT include embodiments where an electrostrictive ceramic consists of PMN-PT and embodiments where an electrostrictive ceramic consists essentially of PMN-PT.

What is claimed is:

1. An actuator comprising:
   a stack of electromechanical layers;
   an antireflective coating comprising a refractive index gradient; and
   electrodes configured to apply an electric field independently across each of the electromechanical layers, wherein an orientation of neighboring electromechanical layers differs by at least approximately 10° and the antireflective coating is disposed over at least a portion of the electrodes opposite to the stack of electromechanical layers.

2. The actuator of claim 1, wherein the stack of electromechanical layers is configured to create a variable cylinder radius and axis in a surface adjacent to the actuator.

3. The actuator of claim 2, wherein the cylinder radius ranges from approximately −1 m to +1 m.

4. The actuator of claim 1, wherein one or more of the electromechanical layers comprise a uniaxially oriented material.

5. The actuator of claim 1, wherein the electromechanical layers comprise an electrostrictive material.

6. The actuator of claim 1, wherein the electromechanical layers comprise a piezoelectric material.

7. The actuator of claim 1, wherein the electromechanical layers comprise polyvinylidene fluoride.

8. The actuator of claim 1, wherein the electromechanical layers are optically transparent.

9. The actuator of claim 1, wherein the electrodes are arranged within the stack of electromechanical layers with an electrode located between each pair of the neighboring electromechanical layers.

10. The actuator of claim 1, wherein the electrodes are optically transparent.

11. The actuator of claim 1, further comprising a reflective layer overlying the stack of electromechanical layers.

12. The actuator of claim 1, further comprising a passive layer bonded to the stack of electromechanical layers.

13. A liquid lens comprising the actuator of claim 1.

14. A liquid lens comprising:
a substrate;
an actuator overlying the substrate;
an antireflective coating comprising a refractive index gradient;
a liquid layer disposed between the substrate and the actuator; and
a seal located between the substrate and the actuator peripheral to the liquid layer, wherein the actuator is configured to create a variable cylinder radius and axis in a surface of the liquid layer.

15. The liquid lens of claim 14, wherein the actuator directly overlies the liquid layer.

16. The liquid lens of claim 14, wherein the
electrodes are configured to apply an electric field independently across each of the electromechanical layers, and an orientation of neighboring electromechanical layers differs by at least approximately 10°.

17. The liquid lens of claim 16, wherein the electromechanical layers each comprise a uniaxially oriented piezoelectric material.

18. A method comprising:
forming an actuator over a transparent substrate, the actuator comprising a stack of electromechanical layers and electrodes configured to apply an electric field independently across each of the electromechanical layers, wherein an orientation of neighboring electromechanical layers differs by at least approximately 10°;
forming an antireflective coating comprising a refractive index gradient over at least a portion of the electrodes opposite to the stack of electromechanical layers;
dispensing a liquid layer between the actuator and the substrate; and
applying a voltage to at least one of the electrodes to create a variable cylinder radius and axis in a surface of the liquid layer.

19. The method of claim 18, wherein applying the voltage creates a spherical profile in the surface of the liquid layer.

20. The method of claim 18, wherein the electrodes comprise a first electrode and a second electrode, and the method further comprises applying a first voltage to the first electrode and applying a second voltage to the second electrode.

* * * * *